United States Patent
Shima et al.

[19]

[11] Patent Number: 5,864,388
[45] Date of Patent: Jan. 26, 1999

[54] SURFACE ACTIVATING PROCESS, AND DEVICE AND LAMP FOR PERFORMING SAID PROCESS

[75] Inventors: Toshiyuki Shima; Akiyasu Yamaguchi, both of Himeji; Shinji Suzuki, Kawasaki, all of Japan

[73] Assignee: Ushiodenki Kabushiki Kaisha, Tokyo, Japan

[21] Appl. No.: 680,317

[22] Filed: Jul. 11, 1996

[30] Foreign Application Priority Data

Jul. 11, 1995 [JP] Japan ................................... 7-175281
Jul. 11, 1995 [JP] Japan ................................... 7-175282

[51] Int. Cl.$^6$ .......................... G03B 27/42; G03B 27/52; G03B 27/54
[52] U.S. Cl. .................. 355/53; 355/55; 355/67
[58] Field of Search ................. 355/53, 55, 67, 355/71, 95; 430/30, 396

[56] References Cited

U.S. PATENT DOCUMENTS 5,543,890  8/1996  Tanaka et al. ............................ 355/53
5,673,102  9/1997  Suzuki et al. ............................ 355/53
5,710,620  7/1995  Taniguchi ................................. 355/53

*Primary Examiner*—R. L. Moses
*Assistant Examiner*—Shival Virmani
*Attorney, Agent, or Firm*—Sixbey, Friedman, Leedom & Ferguson; David S. Safran

[57] ABSTRACT

A surface activating process in which treatment can be performed within a short time and in which activation of undesired areas does not occur is achieved by concentrating ultraviolet light with wavelengths from 200 nm to 300 nm by means of an oval focussing mirror. The ultraviolet light is incident in parallel on a mask via a first reflector, an integrator lens, a shutter, a second reflector, and a collimator, and is radiated through the mask onto a workpiece to activation a surface area of the workpiece. The arc length of the lamp is selected to be within a range from 7.5 to 29 mm to obtain a radiation intensity which is sufficient for surface activation. Furthermore, the relationship $\alpha > 1.5°$ and the relationship $d \times \tan \alpha \leq 0.1$ W are satisfied at the same time, where $\alpha$ is the visual angle of the ultraviolet light, d is the thickness of an oxygencontaining gas layer which is formed between the mask and the workpiece, and W is the width of a minimum unit of the surface areas of the workpiece to be activated. In this way entry of adverse light can be prevented.

7 Claims, 10 Drawing Sheets

SURFACE ACTIVATING PROCESS, AND DEVICE AND LAMP FOR PERFORMING SAID PROCESS

BACKGROUND OF THE INVENTION

1. Field of the Invention

The invention relates to a surface activating process which is used to improve the surface characteristic.

2. Description of the Related Art

Among liquid crystal display devices there is, on the hand, a liquid crystal display devices of the transmission type, which is formed of a liquid crystal panel, a driver to control the latter, and a back light. On the other hand, there is a liquid crystal display of the reflection type which does not use back light, but internal lighting.

A liquid crystal cell conventionally consists of two substrates. On one of these substrates, a driver system for triggering the liquid crystals, such as a thin-film transistor, and electrodes for triggering the liquid crystals, as well as an alignment layer for alignment of liquid crystals to a certain direction, are formed. A light screening film which is called a black matrix is formed on the other of these substrates. In a color liquid crystal cell, a color filter and the above described alignment layer are formed.

The alignment layer is produced by subjecting one surface of a thin film, such as polyimide resin or the like, to a treatment which is called rubbing, and by providing it with fine grooves (scratches) in a certain direction; this is intended to align the molecules of the liquid crystal along these fine grooves in a certain direction.

In a liquid crystal cell, the picture contrast changes according to the angle of view field The angular range in which advantageous contrast is obtained is called the angle of view field of the liquid crystal cell. The greater this angle of view field, the more visible and better the liquid crystal cell becomes. Therefore, there is the important technical object of how a large visual angle is obtained.

In a known process, a pre-tilt angle of the molecules of the liquid crystals is controlled. Here, the term "pre-tilt angle" is defined as an angle for which the molecules of the liquid crystals with reference to the surface of the alignment layer rise with a certain angle when they come into contact with the alignment layer. In the process, the alignment layer is irradiated through a mask with ultraviolet light, and thus, the characteristic of the alignment layer is activated. This technique of controlling the pre-tilt angle is known, for example, from Japanese patent disclosure document HEI 6-222366 and Japanese patent disclosure document HEI 6-281937.

Here, a liquid crystal cell with a wide the angle of view field is produced using the phenomenon that the pre-tilt angle of the areas irradiated with the ultraviolet light decreases and using the measure by which, within this same substrate, areas with different pre-tilt angles are arranged in mixed fashion.

The phenomenon that the pre-tilt angle is changed by irradiation with ultraviolet light is presumably caused by the fact that the surface of the alignment layer is oxidized by the ultraviolet light and that the polarity of the alignment layer changes. To activate the above described alignment layer it is necessary to place the alignment layer within a gas atmosphere which contains oxygen when it is irradiated with ultraviolet light. This means that, in irradiation of the alignment layer with ultraviolet light through the mask, the mask and the surface of the alignment layer (substrate surface) are held at a distance from one another and a gas layer (air) which contains oxygen is formed between the mask and alignment layer.

FIG. 8 is a schematic of the known process for activating the characteristic of the alignment layer by irradiation with ultraviolet light in the above described manner.

On mask MK, a mask pattern MP is formed which partially screens the ultraviolet light. On the substrate 101, the above described thin-film transistor, the above described electrodes for triggering of the liquid crystals and the like, which are not shown in the drawing, are formed and on which alignment layer 102 is formed.

To improve the characteristic of alignment layer 102, as shown in FIG. 8(a), the mask MK, on which the mask pattern MP is formed, is positioned at a distance from the substrate 101 on which alignment the layer 102 is formed, and the mask MK is irradiated with ultraviolet light from above. In this way, as shown in FIG. 8(b), the characteristic of alignment layer 102 is partially activated and the pre-tilt angle of the areas irradiated with the ultraviolet light changes.

To activate the characteristic of the above described alignment layer, ultraviolet light with wavelengths of less than or equal to 300 nm (especially from 200 nm to 300 nm) can be used. A mercury lamp of the long arc type is known as a light source which emits light in this wavelength range. The reason for this is that the distance between the discharge electrodes is great, i.e., it is a few dozen cm to a few hundred cm, that the surface of the emission part is large, and that therefore strong ultraviolet light is easily obtained.

As was described above, a mercury lamp of the long arc type is known as a lamp which is used to activate the characteristic of the alignment layer or the like which is formed on the substrate. In the following, the substrate is called a workpiece. The ultraviolet light from a lamp of this type is, however, scattered light.

If irradiation is performed with ultraviolet light in the state in which the mask and the workpiece surface are separated from one another, as was described above, the component of the light which is obliquely incident on the mask enters the interior of the light screening area of the mask. As a result thereof, areas which are not actually to be activated are irradiated with ultraviolet light and activation of undesired areas is effected. If, for example, in the above described FIG. 8, scattered light is used, ultraviolet light which is obliquely incident enters the areas which are not to be irradiated with ultraviolet light; this causes a change of the pre-tilt angle of the areas in which a change of the pre-tilt angle is actually not wanted.

If, on the other hand, the distance between the mask and the workpiece surface is reduced, or if the two are brought into contact with one another in order to prevent the above described entry of the oblique light, the disadvantage arises that, as a result of the lack of a sufficient amount of oxygen for the activating reaction, sufficient activation cannot be achieved.

To prevent the aforementioned activation of the undesired areas, therefore, it is necessary to irradiate the mask as well as the workpiece with parallel light using an optical system.

If a lamp is used with an arc length such as in a mercury lamp of the long arc type or the like, using a lens with a high degree of parallelism of the central light beam, the degree of parallelism of the light emitted from the middle area of the lamp can be increased. The light which is emitted from the end of the lamp is, however, obliquely incident on the workpiece, this angle being designated the visual angle. The visual angle is defined as a half angle with consideration of a light source. As a result thereof, advantageous parallel light is not obtained and the oblique light enters.

Furthermore, a lamp with a large arc length has a large discharge surface. When an integrator lens or the like is used, it is necessary to enlarge this integrator lens. This leads to the disadvantage of resultant higher costs. In this case, the "are length" is equivalent to the distance between the electrodes of the lamp.

If, on the other hand, a lamp is used with a short arc length, such as a super high pressure mercury lamp or the like, the degree of parallelism of the light can be increased and the visual angle can be decreased. If the visual angle is extremely decreased, light diffraction phaenomenon occurs more. As a result, the exposure of the screened parts increases due to the diffracted light.

Furthermore, a lamp with a short arc length is constructed such that the light with a so-called i-line (365 nm), an h-line (405 nm) and a g-line (436 nm) is emitted with high efficiency. Radiation of the above described ultraviolet light with wavelengths of less than or equal to 300 nm is low in this case. In a lamp with a low arc length (discharge lamp of the short arc type), therefore, in the wavelength range which is necessary for activating the surface of the alignment layer, a irradiance in a sufficient amount cannot be obtained. In addition, when used as a surface activation lamp, it is considered disadvantageous that the duration of irradiation becomes long.

SUMMARY OF THE INVENTION

Therefore, in a surface activating process in which the workpiece is irradiated with light via a mask which is located at a distance from a workpiece and in which surface activation of the workpiece is thus performed, a first object of the invention is to devise a surface activating process in which entry of adverse light (oblique light and diffracted light) can be prevented and in which activation of undesired areas does not occur.

A second object of the invention is to devise an advantageous light source for purposes of surface activation as well as a device, which is suitable for implementing activation of a thin film which is formed on the workpiece, in which the workpiece is irradiated with light through the mask which is located at a distance from the workpiece, such as for implementing activation of an alignment layer on a substrate of liquid crystal cell or the like.

A third object of the invention to devise a lamp for purposes of surface activation in which a high irrationce is obtained in the wavelength range which is necessary for surface activation, and in which surface activation can be achieved within a short period of time.

These objects are achieved according to the invention by the fact that, in a surface activation process in which a mask and a workpiece are arranged adjacent to one another in a state in which an oxygen-containing gas layer is formed between the mask and the workpiece, the above described mask and through the mask, the above described workpiece are irradiated roughly vertically with ultraviolet light, and in which activation of the surface of the workpiece is, thus, effected. Furthermore, the above described ultraviolet light is parallel light, and the conditions $\alpha > 1.5°$ and $d \times \tan \alpha \leq 0.1$ W are satisfied at the same time, where $\alpha$ is the visual angle of the above described ultraviolet light, d is the thickness of the above described gas layer, and W is the width of a minimum unit of the areas to be activated on the above described workpiece.

The objects are achieved according to the Invention, furthermore, by a light source for surface activation being formed of a lamp which emits light which contains at least ultraviolet light with wavelengths from 200 nm to 300 nm, an oval focussing mirror which concentrates the light emitted from the lamp, and an optical system which contains at least one integrator lens and one collimation lens or collimation mirror, and by activating the surface on the workpiece by irradiation of the workpiece with parallel light through the mask which is located adjacent to the workpiece above the oxygen-containing gas layer.

Still further, the noted objects of the invention are achieved by a device for surface activation having an ultraviolet light irradiation part which irradiates the mask and the workpiece roughly vertically with parallel ultraviolet light, a mask carrier part for holding the mask, a workpiece carrier part having a workpiece carrier for holding the workpiece, and a movement device for turning and moving this workpiece carrier in horizontal and vertical directions, a device for adjusting the distance for holding the workpiece and the mask adjacent to one another and for forming the oxygen-containing gas layer between the workpiece and the mask, and a control element which controls each of the above described devices.

The objects are, moreover, achieved according to the invention by using a mercury discharge lamp as the lamp which emits ultraviolet light, in which, within an arc tube made of quartz glass, there is a pair of electrodes, and within which at least mercury and a rare gas are encapsulated, the amount of mercury $M_Q$ (mg/cc) being within the range of $2 \leq M_Q \leq 15$, and the pressure (Pa) of the rare gas P1 at room temperature being within the range of $0.1 \times 10^5 < P1 \leq 5 \times 10^5$. Additionally, the arc length is greater than or equal to 7.5 mm and less than or equal to 29 mm.

The objects are also achieved according to the invention by using a cadmium lamp as the lamp which emits ultraviolet light in which, within an arc tube made of quartz glass, there is a pair of electrodes, and in which at least metallic cadmium and a rare gas are encapsulated, the amount of cadmium C (mg/cc) being within the range from $0.06 \leq C \leq 3$, in which pressure P2 (Pa) of the rare gas at room temperature is within the range of $0.1 \times 10^5 \leq P2 \leq 3 \times 10^5$. Furthermore, the arc length is greater than or equal to 7.5 mm and less than or equal to 29 mm.

The objects are, furthermore, achieved according to the invention by a surface activation device having a lamp for emission of ultraviolet light, with a spherical, electrodeless arc tube in which an oval focussing mirror has an inside diameter of greater than or equal to 7.5 and less than or equal to 29 mm, a microwave cavity container which forms a microwave cavity in which the above described electrodeless arc tube is located and in which coupling to microwaves is performed, and which, at the same time, functions as an oval focussing mirror, a magnetron for generating microwaves, a waveguide for feeding the microwaves generated by the magnetron into the microwave cavity, a coupling means for coupling the microwaves fed by the waveguide to the microwave cavity, and a cooling means for cooling the electrodeless arc tube.

As was described above, the diffraction of light increases and the amount of light which enters due to diffraction becomes greater when the visual angle $\alpha$ is too small. It is conceivable that the size of the visual angle $\alpha$ at which, due to the above described light diffraction, entry of the diffracted light occurs is less than or equal to 1.5°.

If, on the other hand, the visual angle $\alpha$ is too large, the light is incident obliquely on the mask and undesired areas are activated, as was described above.

The maximum value of above described visual angle α can be computed in the manner described below. This means that, if the width of entry of the adverse light is less than or equal to 1/10 of width W of the smallest part of the areas to be activated, in practice, no adverse effect is exerted on the picture of the liquid crystal cell, and therefore, it can be acceptable. The width of entry of the adverse light is, furthermore, represented by a function between thickness d of the gas layer (the distance between the mask and the workpiece) and the visual angle α of the light.

The maximum value $\alpha_{max}$ of the visual angle can, therefore, be denoted with the following formula:

$$d \times \tan \alpha_{max} \leq 0.1 \ W$$

If, here, thickness d of the gas layer is 100 microns and furthermore width W of the areas of the alignment layer to be activated is likewise 100 microns, as was described above, the maximum value $\alpha_{max}$ of the visual angle is roughly 5.7°. This means that it is desirable that visual angle & is within the range described below, if the workpiece is irradiated with light through the mask which is located at a distance to the workpiece and if surface activation is performed with it:

$$1.5° < \alpha < \alpha_{max} (\text{roughly } 5.7°)$$

Visual angle α, on the other hand, depends on the arc length of the lamp, as was described above. If the arc length of the lamp is great, visual angle α becomes greater while, at a small arc length, the visual angle α becomes smaller. This means that it is necessary to select the arc length of the lamp accordingly in a suitable manner in order that visual angle α can be within a certain range.

Therefore, with consideration of construction limitations or the like with respect to implementation of the optical system, an arc length is computed at which visual angle α is within the above described range, as is described below. Here it was found that it is desirable that the arc length is roughly 7.5 mm to obtain a visual angle of 1.5° and that the arc length is roughly 29 mm to obtain a visual angle of 5.7°.

As a lamp for performing surface activation in which a workpiece is irradiated with light through a mask which is located at a distance to the workpiece, as for activation of an alignment layer on a substrate of a liquid crystal cell or the like, a lamp with an arc length of roughly 7.5 mm to 29 mm is, therefore, desired On the other hand, it is known that for purposes of surface activation, ultraviolet light with wavelengths from 200 nm to 300 nm is useful, as was described above. Furthermore, for surface activation of an alignment layer on a substrate of a liquid crystal cell or the like under the above described ultraviolet light, ultraviolet light with wavelengths from 200 to 230 nm is more effective than ultraviolet light with wavelength from 230 to 300 nm. (Ultraviolet light with wavelengths from 200 nm to 230 nm has at least twice the action as ultraviolet light with wavelengths from 230 nm to 300 nm. Therefore, the duration of treatment is only less than or equal to half.)

Therefore, in a mercury lamp, the relative spectral distribution were studied using differences in the amount of mercury, by which the graphic representation in FIG. 4 was obtained.

Furthermore, a relation between the irradiance in the above described wavelength range and the amount of mercury in the lamp was studied, by which the relation shown in FIG. 5 was obtained. FIG. 5 shows a case in which the power input into the lamp arc (power at which the loss, as in a voltage drop of the electrodes or the like, was subtracted from the lamp input power) was kept constant. At the relative spectral distribution in FIG. 4, a spectrometer was used, which was calibrated using a standard lamp (model UV-40 manufactured by Optronic Laboratories, Inc.), to measure the relative spectral distribution of the lamp in the horizontal direction from a distance of 1 m; this was denoted the total radiant energy by multiplication by 4 π.

This result clearly showed that as a lamp for purposes of activating a thin film, it is desirable that the amount of mercury $M_Q$ (mg/cc) is in the range of $2 \leq M_Q \leq 15$.

Furthermore, it is desirable that the encapsulation pressure of the rare gas, in the case of use as a lamp for purposes of activating the thin layer, is $0.1 \times 10^5$ to $5 \times 10^5$ (Pa), as is apparent from FIG. 5 The irradiance intensity increases, the smaller the encapsulation pressure of the rare gas. At an encapsulation pressure of the rare gas of less than or equal to $0.05 \times 10^5$ (Pa), however, when the lamp is ignited, no arc was formed by the anode tip, and an abnormal arc formed. It is, therefore, necessary for stabilization of the igniting characteristic that the encapsulation pressure of the rare gas be greater than or equal to $0.1 \times 10^5$ (Pa).

On the other hand, in a cadmium lamp, the relative spectral distribution were studied using different amounts of the encapsulated metallic cadmium, by which the graphic representation in FIG. 6 was obtained.

Furthermore, a relation between the irradiance of the light in the above described wavelength range and the amount of cadmium was studied, by which the relation shown in FIG. 7 was obtained. FIG. 7 shows a case in which the power input into the lamp arc was kept constant, as in FIG. 5. This result showed that as a lamp for purposes of activating a thin film, it is desirable that the amount of cadmium C (mg/cc) is in the range of $0.06 \leq C \leq 3$.

It is known that, by additional encapsulation of $HgI_2$ or the like in the mercury lamp, and by additional encapsulation of a halide or halogen, such as $CdI_2$ or the like in the cadmium lamp, depending on the lamp input power, the electrode service life and the service life are prolonged before the deterioration of irradiance. They can, therefore, be encapsulated if necessary.

Furthermore, it is desirable that encapsulation pressure P2 of the rare gas in the cadmium lamp, in the case of use as a lamp for purposes of activating the thin film, is $0.1 \times 10^5$ to $3 \times 10^6$ (Pa), as becomes apparent from FIG. 7. The irradiance increases, the greater the encapsulation pressure of the rare gas. At an encapsulation pressure P2 of greater than or equal to $3.8 \times 10^6$ (Pa), however, to increase the pressure tightness, the thickness of the quartz glass which forms the arc tube of the lamp must be increased; this raises costs. It is, therefore, desirable that encapsulation pressure P2 be less than or equal to $3 \times 10^6$ (Pa).

It can be derived from the above described FIG. 6 that, in the radiant light of the cadmium lamp, more ultraviolet light with the wavelengths from 200 to 230 nm which are especially effective for surface activating is obtained, and therefore, that a cadmium lamp is more suited to surface activation than a mercury lamp.

On the other hand, the mercury lamp has less ultraviolet light with wavelengths from 200 nm to 230 nm than the cadmium lamp, as was described above. In the mercury lamp according to the invention in which the amount of mercury $M_Q$ (mg/cc) is within the range of $2 < M_Q \leq 15$, and in which, also, the encapsulation pressure P1 (Pa) of the rare gas is in the range from $0.1 \times 10^5 \leq P1 \leq 5 \times 10^5$, however, an irradiance in an amount sufficient for surface activating is obtained. Therefore the mercury lamp according to the invention can be used to a sufficient degree for practical purposes.

Next, the intensity of the light emitted from the lamp was checked. In a conventional discharge lamp, the intensity of the emitted light is greater, the greater the power supplied to the arc (the power which contributes to emission). This means that the radiation energy E of the lamp can be approximately designated E=a×P (a is a proportional constant), where P is the power which is supplied to the arc and the encapsulation amount of mercury $M_Q$ is kept constant.

Furthermore, the above described power P can be represented by the relation P=b×A×I (b is a proportional constant, A is the arc length, and I is the current) and above described radiation energy E approximately by the relation E=c×A×I (c is a proportional constant). Here, the upper limit of the current I depends on the electrode configuration of the lamp, the cooling efficiency of the lamp and the like. Moreover, at an overly large current, damage to the electrodes is more possible, and efficiency drops as a result of a voltage drop on the electrodes or the like. The upper boundary is, therefore, necessarily fixed and cannot be easily increased.

This means that, to increase radiation energy E of the lamp, it is necessary to increase arc length A. In this way, radiation energy E of the lamp and the irradiance can be increased.

In the above described discharge lamp of the short arc type, such as a conventional super high pressure mercury lamp or the like, due to its low arc length and its short distance between the electrodes, radiation energy E of the lamp cannot be increased. The intensity of the emitted light decreases in this case.

If, conversely, the arc length can be roughly 7.5 mm to 29 mm, as was described above, the power supplied to the arc can be increased and a light intensity required for activating the thin film can be obtained.

This means that, in a lamp for purposes of surface activation, by maintaining an arc length at which the visual angle $\alpha$ is within the range from $1.5° < \alpha \leq \alpha_{max}$ (roughly 5.7°), entry of the adverse light can be prevented without placing a concave lens or the like in the optical system. Thus, the configuration of the optical system can be simplified, and at the same time, the irradiation energy which is necessary for surface activation can be obtained.

In the following, the invention is further described using several embodiments shown in the drawing.

DETAILED DESCRIPTION OF THE PREFERRED EMBODIMENTS

Figure 1:
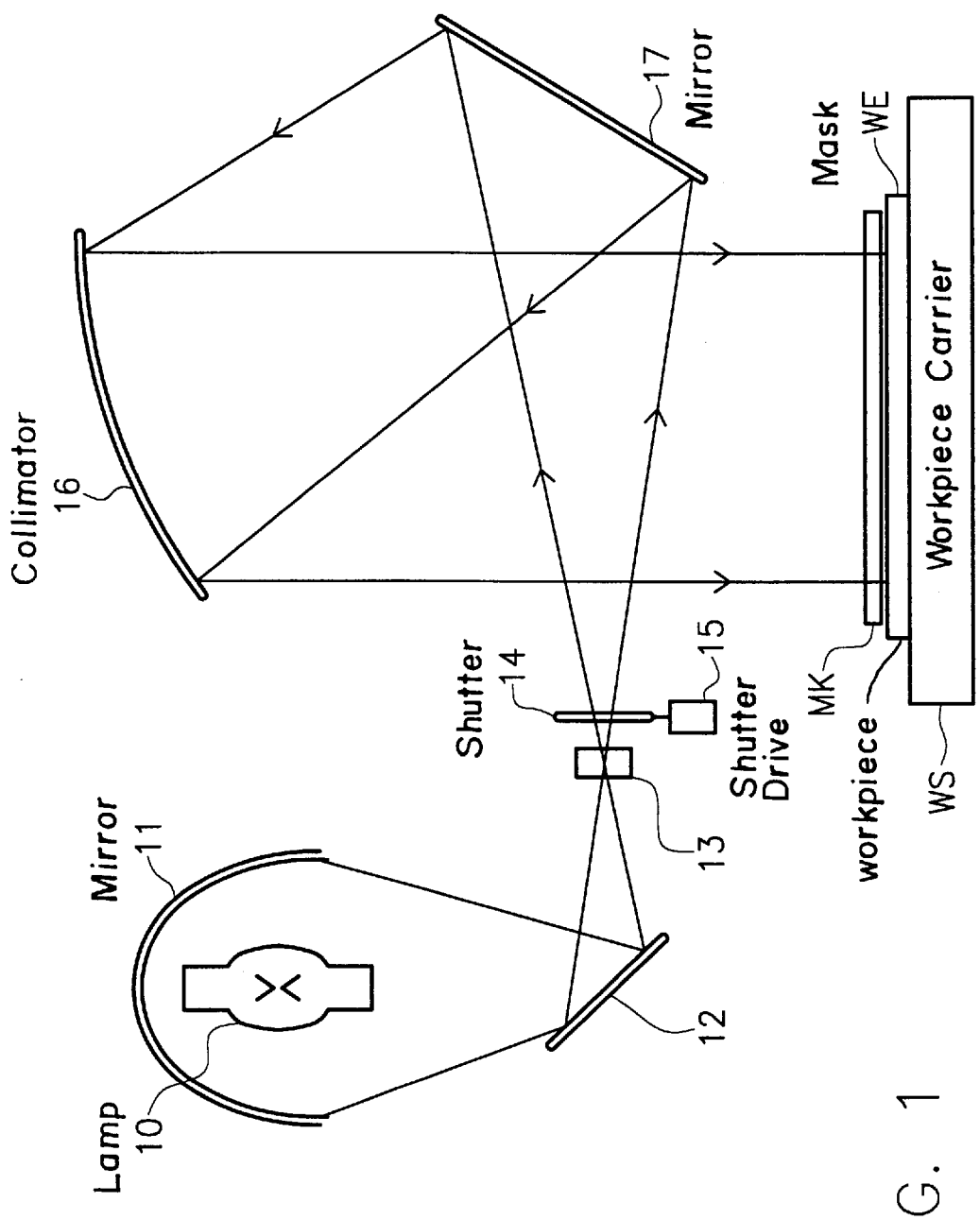
FIG. 1 is schematic representation of an embodiment of an activation process of the present invention.

FIG. 1 is schematically illustrates one example, according to the invention, of an arrangement of an ultraviolet light source for implementing activation of the alignment layer on a substrate of a liquid cristal cell.

Figure 2:
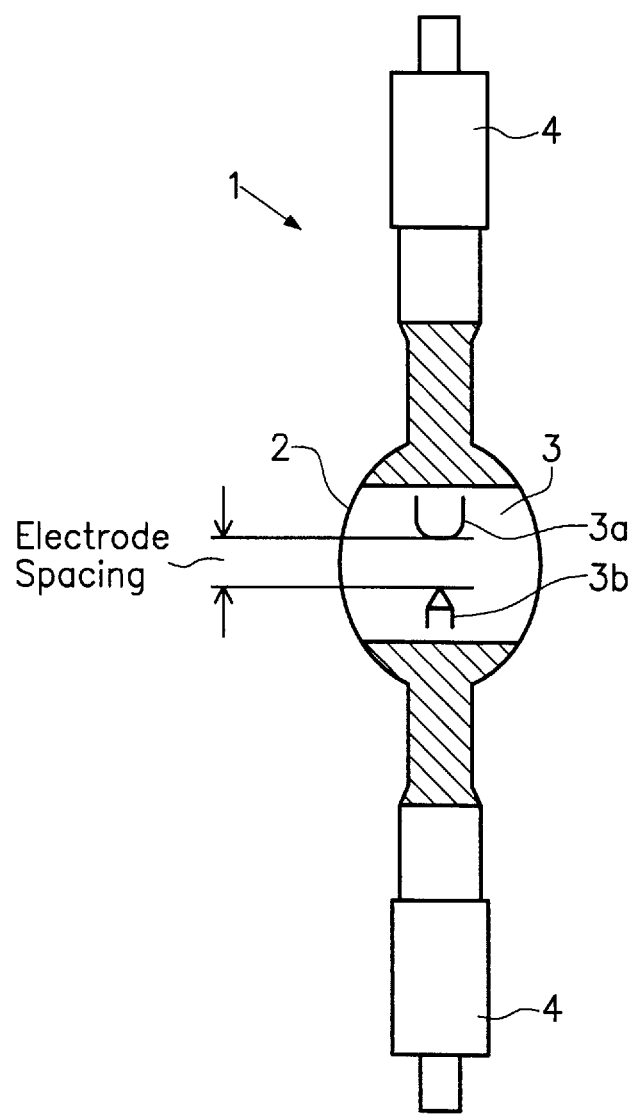
FIG. 2 schematically shows one embodiment of a discharge lamp according to the invention.

In the figure, a lamp 10 for which the discharge lamp schown in FIG. 2 can be used for direct currents, or a discharge lamp for alternating currents can be used with the same arrangement.

Lamp 10 is located at a first focal point of an oval focussing mirror 11. A first flat reflector 12 reflects light emitting by lamp 10 through an integrator lens 13. Directly in front of or behind integrator lens 13, there is a circular diaphragm which is not shown in the drawing. The reason for this is to prevent the visual angle of the light irradiating the workpiece from differing according to the direction on the workpiece surface, because the arc spot of lamp 10 is not actually circular (spherical). The shape of the light beam can be determined by the arrangement of the circular diaphragm.

Following the integrator lens 13 and the noted diaphragm is a shutter 14 which is driven by means of shutter drive device 15 and which opens and closes the optical path. A collimator 16 is also provided and for which a collimation lens (convex lens) or a collimation mirror (concave mirror) can be used. In FIG. 1, collimator 16 is a collimation mirror (concave mirror). Furthermore, by using a concave mirror as collimator 16, an irradiation device can be formed at low cost and it irradiates a larger surface than a lens. A second plane mirror 17 enables the degree of freedom of the arrangement of oval focussing mirror 11, collimation mirror 16 or the like to be increased and a compact device obtained.

A mask MK on which a light screening pattern is formed, and a workpiece WE on which several devices of liquid crystal displays are formed are disposed below collimator 16. Mask MK and workpiece WE are, as was described above, spaced at a distance of roughly 100 microns from one another, an oxygen-containing gas layer being formed between them. Workpiece WE is, furthermore, located on a workpiece carrier WS, such that its alignment layer becomes the upper surface, and is held in placed using an attachment means such as, for example, a vacuum chuck or the like. Workpiece WE has conventionally four or six devices and has a maximum size of 600 mm ×700 mm; however, conventionally, a size of roughly 365 mm ×460 mm is used.

In FIG. 1, ultraviolet light which is emitted from lamp 10 is concentrated by means of oval focussing mirror 11 and is incident via first plane mirror 12 on integrator lens 13. Furthermore, it is incident via shutter 14 and second plane mirror 17 on collimator 16. The ultraviolet light which is reflected from collimator 16 irradiates workpiece WE via mask MK.

FIG. 2 shows one example of the discharge lamp 1 according to the invention for direct current which emits ultraviolet light. Discharge lamp 1 has an arc tube 2 made of quartz glass, within which mercury and rare gas or metallic cadmium and rare gas are encapsulated.

In the case where mercury is encapsulated, an amount of mercury $M_Q$ (mg/cc) in the range of $2 \leq M_Q \leq 15$ and an encapsulation pressure P1 (Pa) of the rare gas in the range of $0.1 \times 10^5 \leq P1 \leq 5 \times 10^5$ are selected.

In the case where metallic cadmium is encapsulated, an amount of cadmium C (mg/cc) in the range of $0.06 \leq C \leq 3$ is selected together with an encapsulation pressure P2 (Pa) of the rare gas in the range of $0.1 \times 10^5 \leq P2 \leq 3 \times 10^6$ (Pa).

Electrodes 3 comprise an anode 3a and a cathode 3b. The distance between electrodes 3a and 3b is roughly 7.5 mm to 29 mm in order that the arc length is 7.5 mm to 29 mm. Furthermore, reference number 4 designates lamp holder end caps. While FIG. 2 shows a discharge lamp for direct current, in the same way, a discharge lamp for alternating current can be provided in which the electrodes have a different shape, but other aspects are essentially the same.

In the ultraviolet light source shown in FIG. 1, conditions were determined under which above described visual angle $\alpha$ ($1.5° < \alpha < \alpha_{max}$) is accomplished; this is described below.

Figure 3:
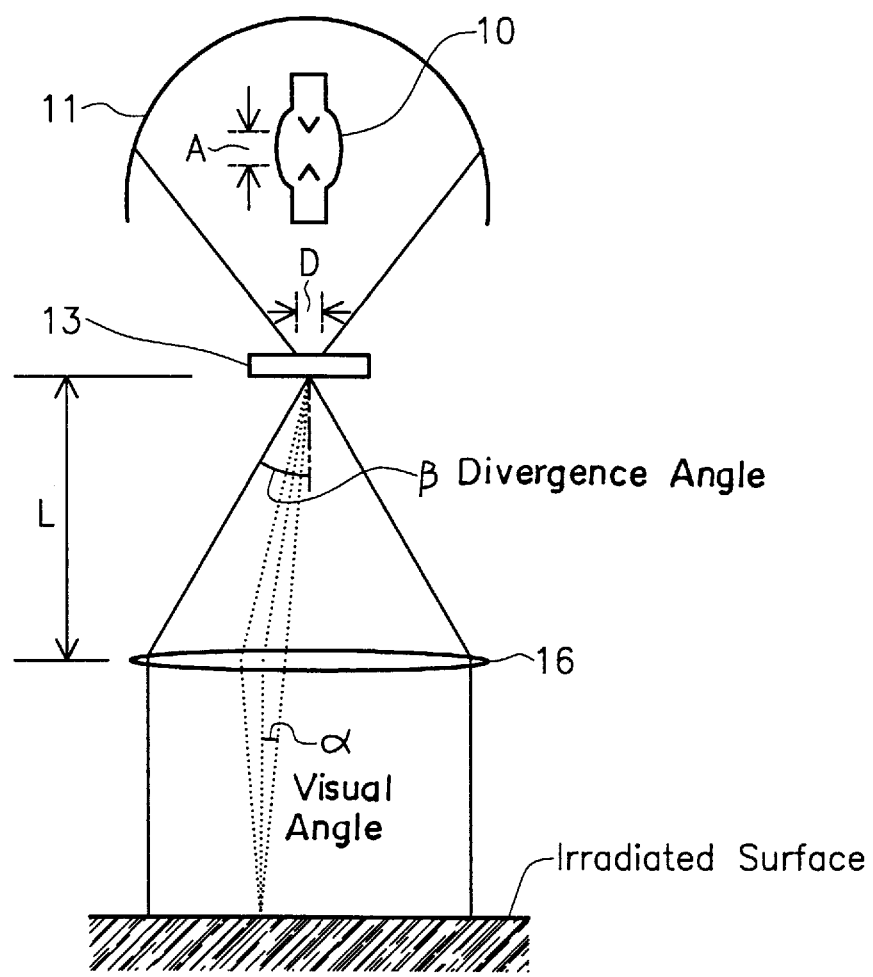
FIG. 3 schematically shows a light source according to the invention which emits ultraviolet light.
Figure 4:
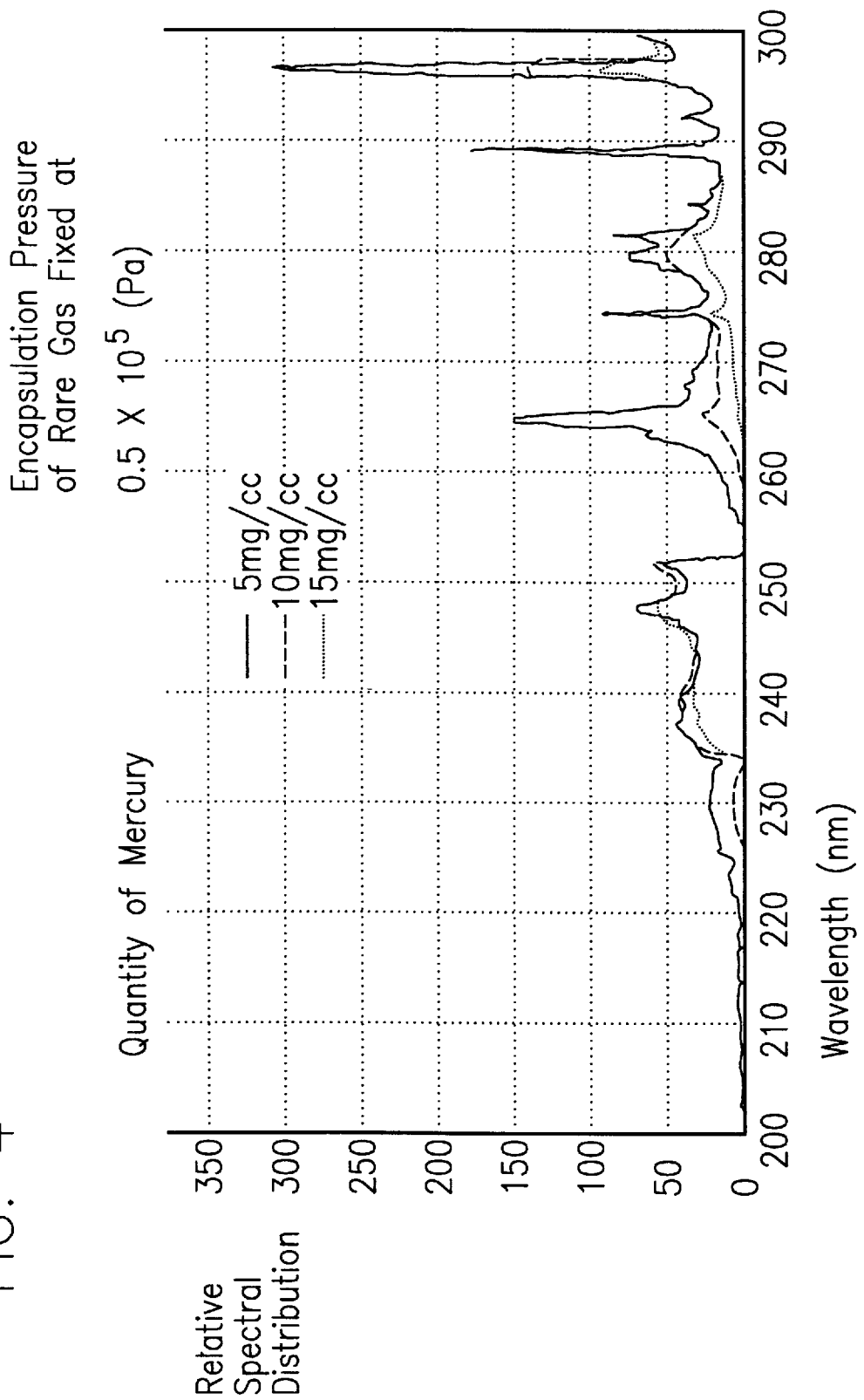
FIG. 4 is a graph showing the spectral distribution of a mercury discharge lamp.
Figure 5:
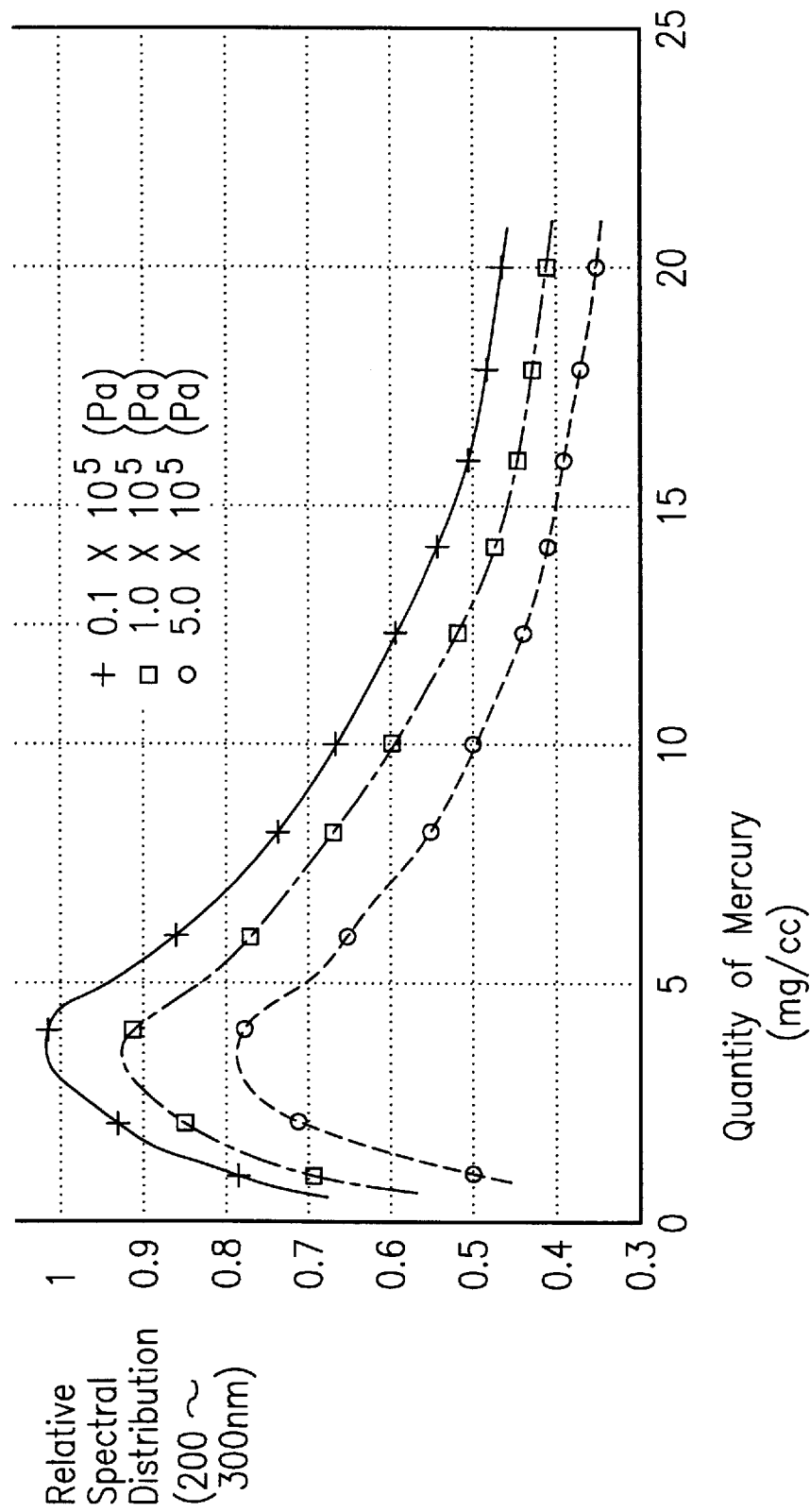
FIG. 5 is a graph showing the relation between the amount of mercury and the integral irradiance of ultraviolet light.
Figure 6:
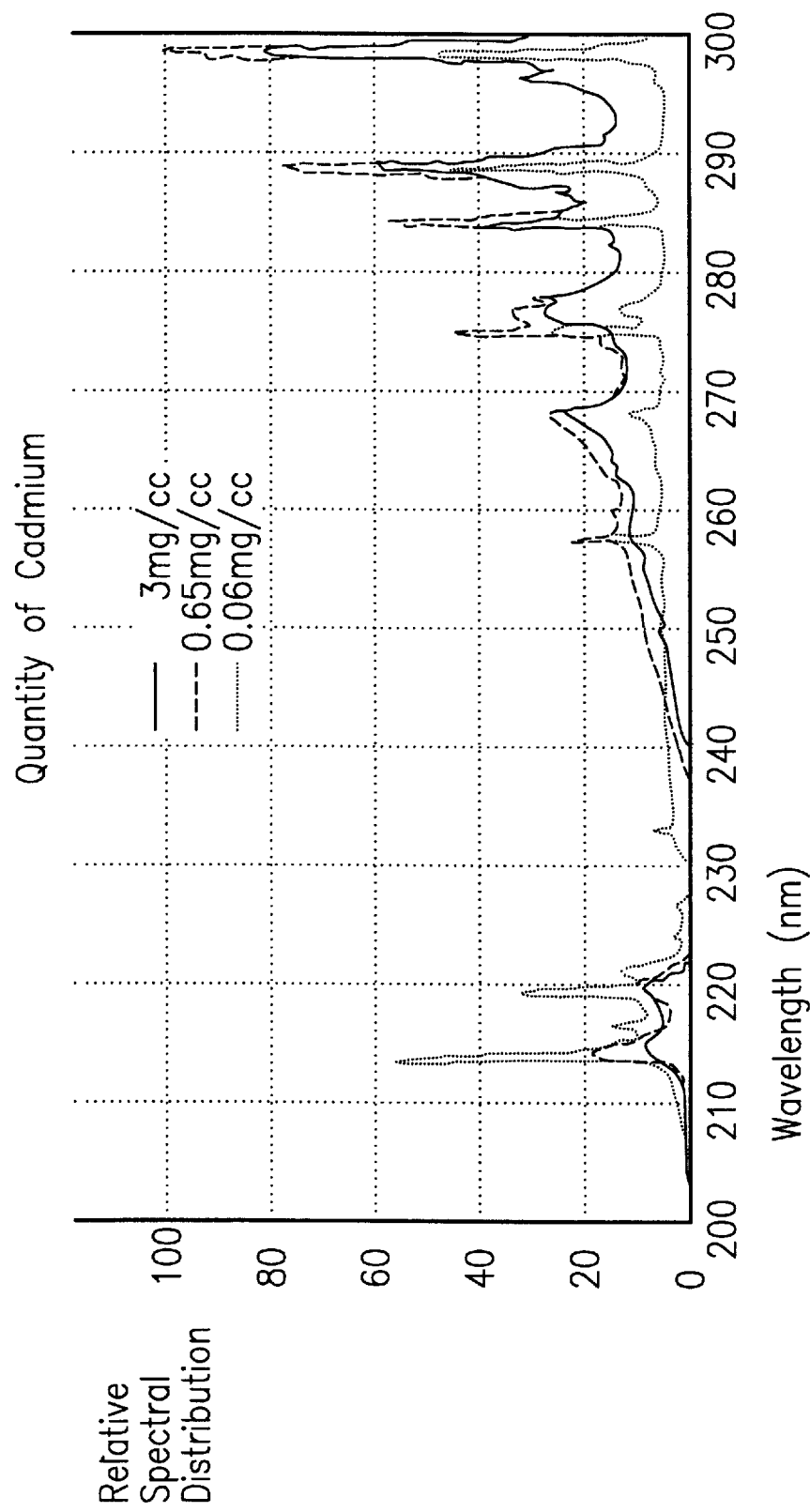
FIG. 6 is a graph showing the spectral distribution of a cadmium lamp.
Figure 7:
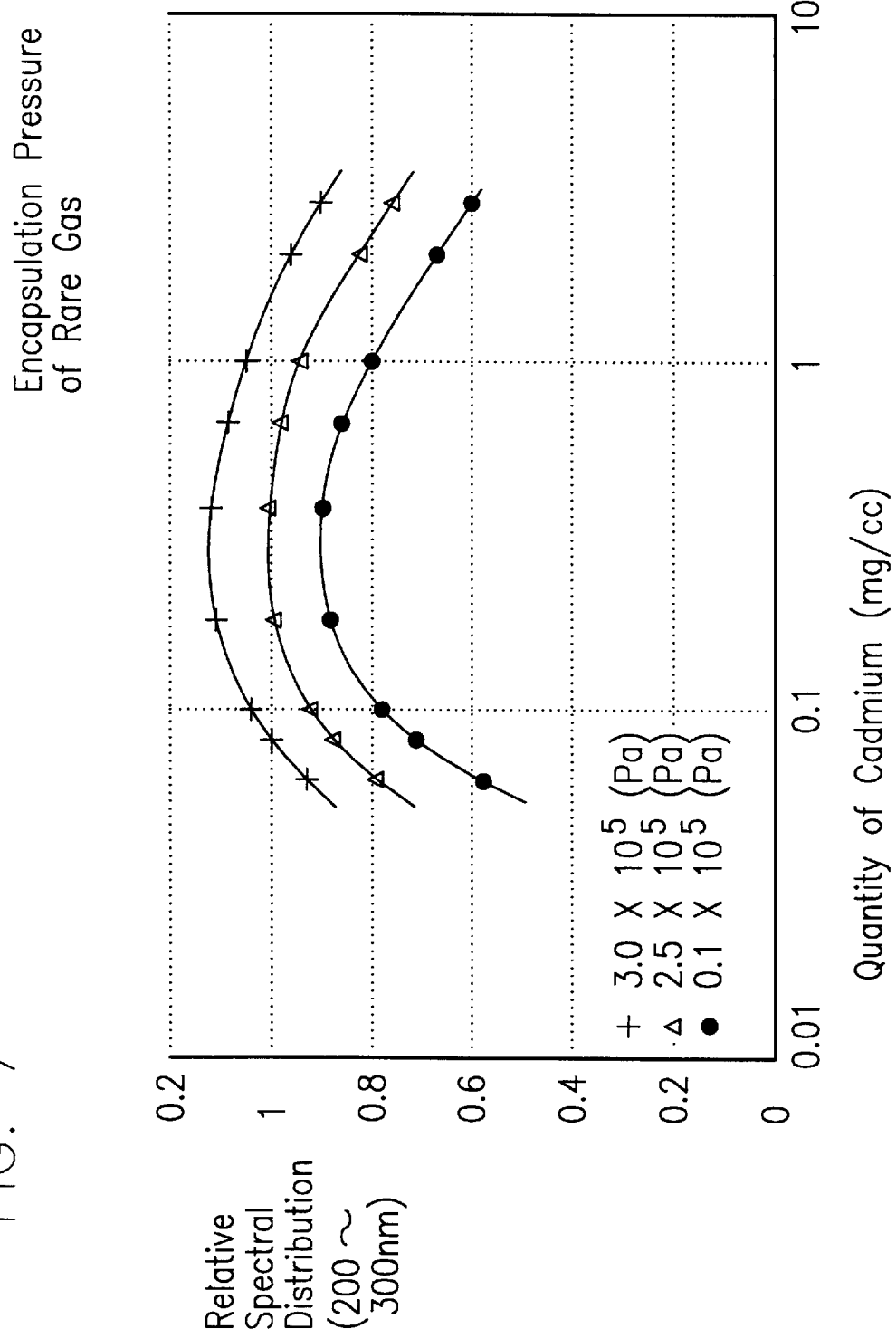
FIG. 7 is a graph showing the relation between the amount of cadmium and the integral irradiance of ultraviolet light.
Figures 8A, 8B:
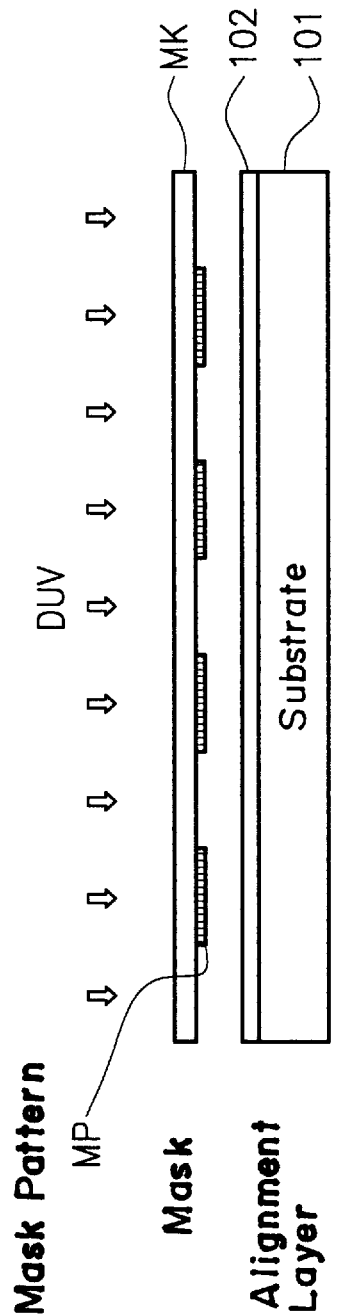
FIG. 8(a)–8(b) are schematic representations of activation of the characteristic of an alignment layer by irradiation with ultraviolet light.

FIG. 3 is a schematic depiction in which the ultraviolet light source shown in FIG. 1 is described and explained in simplified form. In FIG. 3, to simplify understanding, the collimation mirror serving as collimator 16 is replaced by a collimation lens (convex lens). The collimation mirror (concave mirror) and collimation lens (convex lens) have equivalent functions as a collimator, in which only their optical paths differ from one another with respect to reflection or transmission.

(a) Relation between visual angle $\alpha$ and the arc length

If the arc length is designated A, the magnification factor of oval focussing mirror 11 is designated $M_S$, and the reduction coefficient of integrator lens 13 by the diaphragm K, then the diameter D of the light which is incident on integrator lens 13 can be denoted using the following formula (1):

$$D = A \times M_S \times K \quad (1)$$

Next, if the distance between integrator lens 13 and the collimator 16 is designated L, the visual angle $\alpha$ can be ascertained with the following formula (2):

$$\tan \alpha = D/2L \quad (2)$$

Based on the relations denoted above by formulas (1) and (2), the following formula (3) can, therefore, be derived:

$$A = 2L \times \tan \alpha / (M_S \times K) \quad (3)$$

(b) Computation of arc length A

Conventionally, the magnification factor $M_S$ of oval focussing mirror 11 in the range from 10 to 60 is used. The smaller the magnification factor, the more the size of integrator lens 13 can be reduced However, in doing so, the angle of incidence of the light incident on integrator lens 13 becomes greater, by which construction of the integrator lens becomes difficult, and by which uniformity is difficult to achieve.

If, conversely, the magnification factor is increased, a large integrator lens is needed according to the size of the enlarged arc spot. Furthermore, in this case, deterioration of visual angle $\alpha$ occurs. It is therefore necessary to select an optimum magnification factor for magnification factor $M_S$ of oval focussing mirror 11 according to the applications. In the computation given below, a magnification factor of 18 is used.

Furthermore, a reduction coefficient K through the diaphragm of roughly 0.65 is conventionally used. Distance L between integrator lens 13 and collimator 16 is determined by the required irradiation surface and by divergence angle $\beta$ of the light emitted from integrator lens 13.

The term "divergence angle" $\beta$ is defined as the half angle of scattering of the light which has emerged from integrator lens 13, as is illustrated in FIG. 3. This means that the larger divergence angle $\beta$, the smaller distance L becomes, the more the light increases and the larger the surface which can be irradiated by means of a compact optical system. If, however, divergence angle $\beta$ increases too much, the curvature of collimator 16 becomes greater, by which production becomes difficult, and moreover, the image error (or aberration) becomes greater.

Therefore, conventionally, a divergence angle $\beta$ of 5° to 15° is used. For purposes of manufacture of a liquid crystal cell, as a result of the large substrate, a large irradiation surface is required, as was described above.

In the computation indicated below, a 10.7° divergence angle $\beta$ was used. If, with this divergence angle $\beta$, a distance L is determined between the integrator lens 13 and the collimator 16 which is necessary for irradiation of a substrate of, for example, 400×500 mm, the following is obtained:

$$L = (\sqrt{(400 \times 400 + 500 \times 500)/2})/\tan 10.7° = 1700 \text{ mm}$$

If, under the above described assumption, the arc length A for obtaining the above described visual angle of 1.5° and the above described visual angle of 5.7° is determined, the following arises:

(1) Arc length $A_{1.5}$ for obtaining a visual angle of 1.5°

By substituting the values $M_S = 18$, K=0.65, L=1700 mm and $\alpha = 1.5°$ into above described formula (3), the following is obtained:

$$\begin{aligned} A_{1.5} &= 2L \times \tan\alpha / (M_S \times K) \\ &= (2 \times 1700 \times \tan 1.5°)/(18 \times 0.65) \\ &= 7.6 \text{ mm} - 7.5 \text{ mm} \end{aligned}$$

(2) Arc length $A_{5.7}$ for obtaining a visual angle of 5.7°

By substituting the values of $M_S = 18$, K=0.65, L=1700 mm and $\alpha = 5.7°$ into above described formula (3), the following is obtained;

$$\begin{aligned} A_{5.7} &= 2L \times \tan\alpha / (M_S \times K) \\ &= (2 \times 1700 \times \tan 5.7°)/(18 \times 0.65) \\ &= 29 \text{ mm} \end{aligned}$$

As is described above, by using a lamp with an arc length A of 7.5 mm to 29 mm, the visual angle $\alpha$ of the light incident on mask MK can be ascertained using a feasible optical system in the range from $1.5° < \alpha \leq 5.7°$, by which aktivation of the undesired areas due to entry of adverse light can be prevented.

Furthermore, the energy emitted by the lamp can be increased to a sufficient degree in comparison to a conventional discharge lamp of the short arc type by the measure by which the arc length A is the above described length. In this way, activation of the alignment layer on a substrate of a liquid crystal cell with the desired duration is enabled.

Next, a check was performed with respect to the energy which is necessary for activating the alignment layer on a substrate on a substrate of a liquid cristal cell, from which follows:

To activate the alignment layer on a substrate of a liquid crystal cell, energy of roughly 0.5 J/cm² is necessary. If it isassumed that treatment of a substrate of 40×50 cm is achieved in 90 seconds, energy E1 of the ultraviolet light, which is necessary for activation of the substrate, having wavelengths from 200 nm to 300 nm can be computed according to the following formula:

$$E1 = 0.5 \times 40 \times 50/90 = 11 \text{ W}$$

If, here, a 20% efficiency of the optical system is assumed, then energy E2 of 55 W of the ultraviolet light emitted from the lamp is required according to the following formula:

$$E2 = 11/0.2 = 55 \text{ W}$$

On the other hand, in a mercury discharge lamp, an arc power (power which is supplied to the arc for which the loss, as in a voltage drop across the electrodes or the like, was subtracted, and which corresponds to the emission intensity) of roughly 20 to 100 W/mm can be obtained. Therefore, light energy which is necessary for activation, as was described above, can be drawn off by the measure by which the arc length is roughly 7.5 mm to 29 mm.

Figure 9:
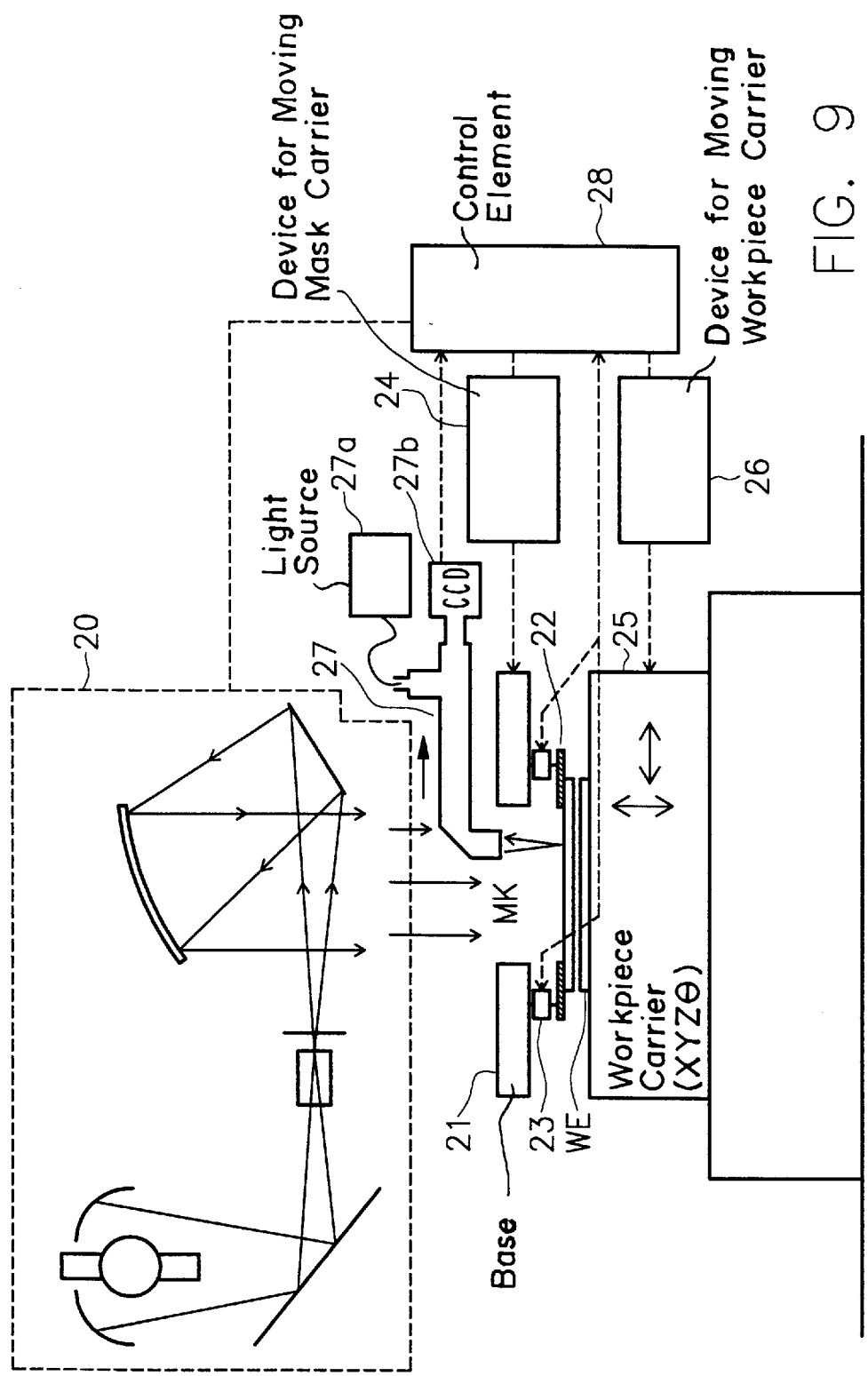
FIG. 9 is schematic representation of a device for surface activation according to the invention.

FIG. 9 shows the overall configuration of the surface activating device according to the invention. In the representation, an ultraviolet irradiation part 20 is identical to the ultraviolet light source which is shown in FIG. 1, and thus, is not further described here. Furthermore, for the lamp within irradiation part 20, not only a mercury discharge lamp or cadmium lamp, but also an electrodeless arc tube can be used, as is described below.

The ultraviolet light from this irradiation part 20 is incident on workpiece WE through mask MK. The above described alignment layer is formed on workpiece WE. Mask MK and workpiece WE are, as was described above, arranged at a distance of roughly 100 microns from one another, in which an oxygen-containing gas layer is formed between them. Furthermore, workpiece WE is placed on workpiece carrier 25, such that the alignment layer becomes the upper surface, and is attached using a means such as a vacuum chuck or the like. Furthermore workpiece WE is irradiated overall with ultraviolet light, and thus, activation of the alignment layer of each substrate is accomplished. However, any area of workpiece WE to be irradiated can also be exposed in steps and the alignment layer can be activated by gradually moving workpiece WE.

A base 21 supports the mask carrier 22 which holds mask MK. Mask carrier 22 has a positioning device for setting mask MK in a predetermined position and a vacuum chuck for holding the mask by vacuum suction. suction.

A device 23 is provided for adjusting the mask MK relative to the workpiece WE in directions parallel to one another, and at the same time with a constant distance, is located between the base 21 and the mask carrier 22 at least at three points. Regarding this distance setting device, reference is made to earlier European patent application EP 0 633 505 A1 of the same assignee.

A device 24 serves for moving the mask carrier 22 the mask carrier 22 to a predetermined position. A device 26 serves for moving the workpiece carrier 25 to a predetermined position. A microscope 27 has a light source 27a, which emits alignment light, and a CCD sensor 27b. The light from the light source 27a is radiated onto the mask MK and the workpiece WE, the light reflected therefrom is picked up by the CCD sensor 27b, and the alignment marks of mask MK and workpiece WE are brought into agreement with one another.

A control element 28, which is comprised of a processor or the like, controls the positions of the mask MK and workpiece WE by means of the device 24 for moving the mask carrier and by means of the workpiece carrier 26 which, at the same time, controls distance setting device 23, and which also controls the irradiation part 20.

In the following, treatment with the above described surface activating device is described:
1) First, mask MK is placed on mask carrier 22 and held by vacuum suction.
2) Workpiece carrier 25 is lowered and workpiece WE is put in place.
3) Workpiece carrier 25 is raised and workpiece WE and mask MK are adjusted in directions parallel to one another while maintaining a constant distance between each other.
4) Positioning of mask MK to workpiece WE is accomplished.
5) The ultraviolet light is emitted and activation treatment of the surface is performed.
6) Workpiece carrier 25 is lowered and workpiece WE is removed.

Figure 10:
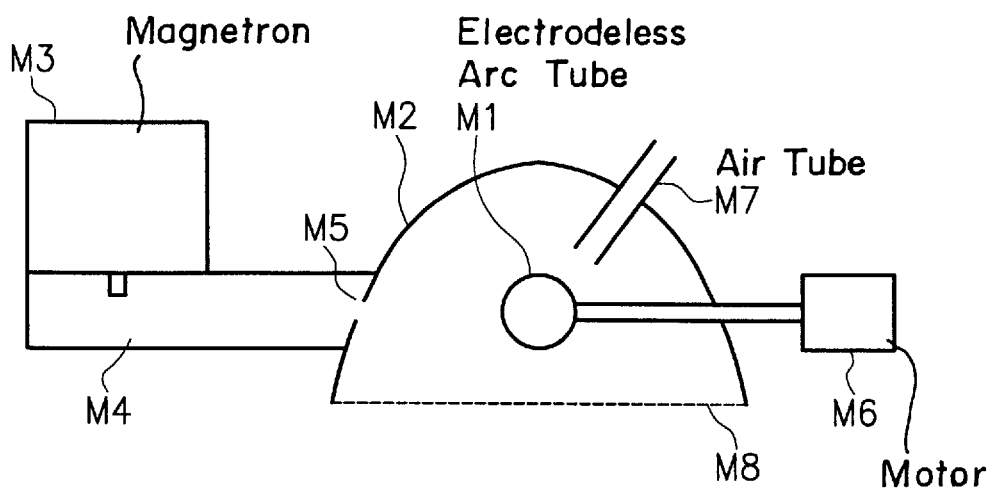
FIG. 10 shows a schematic of another light source according to the invention which emits ultraviolet light.

FIG. 10 shows a light source which emits ultraviolet light, in which, as the lamp which emits the ultraviolet light, a lamp provided with electrodes, such as a mercury discharge lamp or a cadmium lamp, is not used, and in which an electrodeless lamp M1 is used instead.

A microwave cavity M2 functions as an oval focussing mirror for the spherical electrodeless lamp M1, and a magnetron M3, which is connected to a current source (not show) in the drawing, feeds microwaves to the cavity M2 via a waveguide M4 and a window M5. A motor M6 is provided for turning lamp M1, a cooling tube M7 is provided for cooling the lamp, and a metal mesh M5 covers the open end of the microwave cavity M2.

Via the microwave power produced by magnetron M3 and routed by means of waveguide M4 through feed window M5 into the microwave cavity M2, a mixed gas within lamp M1 is excited and ultraviolet light is produced. Furthermore, lamp M1 is turned by motor M6 and cooled by cooling air which is blown in through cooling tube M7.

As electrodeless lamp M1, for example, a lamp with an encapsulated mixed gas can be used as described below:
Inside diameter of the bulb:
7.5 mm to 29 mm (optimum value of 18.5 mm, volume at 3.3 cm$^3$)
Encapsulated amount of mercury:
8.65 mg/cc
Encapsulated amount of mercury (II)-chloride (mercuric chloride):
0.03 mg/cc
Encapsulated amount of argon: 90 torr (at room temperature)

Furthermore the "arc length" in this electrodeless lamp is identical to the inside diameter of the spherical part of the arc tube.

ACTION OF THE INVENTION

As was described above, according to the invention the following effects can be obtained:

(1) Entry of adverse light, and thus activation of undesired areas on the workpiece, can be prevented by the measure by which, with roughly vertical irradiation of a mask and a workpiece with ultraviolet light through the mask in a state in which between the above described mask and the above described workpiece, an oxygen-containing gas layer is formed, and with activation of the surface on the workpiece, the above described ultraviolet light is parallel light, and by which the conditions $\alpha > 1.5°$ and $d \times \tan \alpha \leq 0.1$ W are satisfied at the same time, $\alpha$ is the visual angle of the ultraviolet light, d is the thickness of the gas layer and W is the width of a minimum unit of the areas to be activated on the workpiece.

Furthermore, by the measure by which visual angle α is in the above described range, the arc length of the lamp which emits ultraviolet light can be increased and the irradiation energy necessary for surface activating can be ensured (2) The visual angle α in a necessary range can be ensured without using optical parts to increase the visual angle, such as a concave lens or the like, by the measure by which the arc length of the mercury discharge lamp and of the cadmium lamp and the inside diameter of the electrodeless lamp are greater than or equal to 7.5 and less than or equal to 29 mm. In this way, the arrangement of the optical system can be simplified, and furthermore, the irradiation energy necessary for surface activation can be adequately ensured.

It is to be understood that although preferred embodiments of the invention have been described, various other embodiments and variations may occur to those skilled in the art. Any such other embodiments and variations which fall within the scope and spirit of the present invention are intended to be covered by the following claims.

We claim:

1. Surface activating process comprising the steps of arranging a mask and a workpiece adjacent to one another, enabling an oxygen-containing gas layer to be formed between the mask and the workpiece, irradiating the workpiece through the mask in a roughly vertical direction with ultraviolet light, and activating a surface of the workpiece; wherein said irradiating step is performed with parallel ultraviolet light while satisfying the conditions $\alpha > 1.5°$ and $d \times \tan\alpha \leq 0.1$ W at the same time, where α is a visual angle of the ultraviolet light, d is a thickness of the gas layer between the mask and the workpiece, and W is a width of a minimum unit of areas of the surface of the workpiece to be activated.

2. Surface activating process according to claim 1, wherein said irradiating step is performed using a light source comprising a lamp which emits light which contains at least ultraviolet light with wavelengths from 200 nm to 300 nm, an oval focussing mirror which concentrates the light emitted from the lamp, and an optical system which contains at least one integrator lens and one collimator and with the mask, through which the surface of the workpiece is irradiated, is located adjacent to the workpiece above the oxygen-containing gas layer.

3. Surface activating process according to claim 1, comprising the further steps of holding the mask with a mask carrier part and holding the workpiece with a workpiece carrier of a workpiece carrier part which has a movement device for turning and moving the workpiece carrier in horizontal and vertical directions; and wherein said arranging and forming steps are performed using a control device for operating said carrier parts and a positioning device for adjusting the distance between the workpiece and the mask.

4. Surface activating process according to claim 1, wherein said irradiating step is preformed using a mercury discharge lamp having an arc tube made of quartz glass within which a pair of electrodes are spaced at a distance producing an arc length which is greater than or equal to 7.5 mm and less than or equal to 29 mm, and in which at least mercury and a rare gas are encapsulated, the mercury being encapsulated in an amount $M_Q$ (mg/cc) which is within a range of $2 \leq M_Q \leq 15$, and the rare gas being encapsulated at a pressure P1 (Pa)₅ at room temperature which is within a range of $0.1 \times 10^5 \leq P1 \leq 5 \times 10^5$.

5. Surface activating process according to claim 1, wherein said irradiating step is performed using a cadmium lamp having an arc tube made of quartz glass within which a pair of electrodes are-spaced at a distance producing an arc length which is greater than or equal to 7.5 mm and less than or equal to 29 mm, and in which at least metallic cadmium and a rare gas are encapsulated, the cadmium being encapsulated in an amount C (mg/cc) which is within a range from $0.06 \leq C \leq 3$, and the rare gas being encapsulated at a pressure P2 (Pa) at room temperature which is within a range of $0.1 \times 10^5 \leq P2 \leq 3 \times 10^6$.

6. Surface activating process according to claim 1, wherein said irradiating step is performed using a lamp which has a spherical, electrodeless arc tube and an oval focussing mirror with an inside diameter that is greater than or equal to 7.5 and less than or equal to 29 mm, a microwave cavity container which forms a microwave cavity in which the electrodeless arc tube is located and in which coupling to microwaves is performed and which, at the same time, functions as an oval focussing mirror, a magnetron for generating microwaves, and a waveguide and coupling means for feeding the microwaves generated by the magnetron into the microwave cavity; and a cooling means for cooling the electrodeless arc tube.

7. Device for surface activating a workpiece comprising an ultraviolet light irradiation part which irradiates a mask and a workpiece roughly vertically with parallel ultraviolet light; a mask carrier part for holding the mask; a workpiece carrier part having a workpiece carrier for holding the workpiece, and a movement device for turning and moving the workpiece carrier in horizontal and vertical directions; a device for adjusting the distance between the workpiece and the mask for enabling an oxygen-containing gas layer to be formed between the workpiece and the mask; and a control element for operating said carrier parts and the positioning device for adjusting the relative position of the workpiece with respect to the mask.

* * * * *